US008866642B2

United States Patent
Ron et al.

(10) Patent No.: US 8,866,642 B2
(45) Date of Patent: Oct. 21, 2014

(54) UNIQUELY IDENTIFIABLE KEYS FOR ELECTRONIC KEYBOARDS

(75) Inventors: Uri Ron, Tel Aviv (IL); Eyal Bychkov, Hod Hasharon (IL); Itay Sherman, Hod Hasharon (IL)

(73) Assignee: Google Inc., Mountain View, CA (US)

( * ) Notice: Subject to any disclaimer, the term of this patent is extended or adjusted under 35 U.S.C. 154(b) by 1255 days.

(21) Appl. No.: 11/986,637

(22) Filed: Nov. 23, 2007

(65) Prior Publication Data

US 2009/0135030 A1    May 28, 2009

(51) Int. Cl.
| | | |
|---|---|---|
| H03K 17/94 | (2006.01) |
| H03M 11/00 | (2006.01) |
| G06F 3/02 | (2006.01) |
| G09G 5/00 | (2006.01) |
| H03M 11/24 | (2006.01) |

(52) U.S. Cl.
CPC ................................. *H03M 11/24* (2013.01)
USPC .................. 341/26; 341/22; 341/34; 345/168

(58) Field of Classification Search
USPC ............... 715/866; 345/168, 172; 341/22–33, 341/153; 400/100, 472, 477, 479, 479.1, 400/479.2; 200/5 R, 5 A, 502, 509–517, 281, 200/262–270; 340/1.1–16.1, 407.1–407.2; 380/52
See application file for complete search history.

(56) References Cited

U.S. PATENT DOCUMENTS

| | | | |
|---|---|---|---|
| 4,412,209 A | 10/1983 | Frame et al. | |
| 4,725,816 A | 2/1988 | Petterson | |
| 4,872,008 A | 10/1989 | Ohtsuka et al. | |
| 4,918,634 A * | 4/1990 | Nishimori ..................... 708/142 |
| 5,057,836 A * | 10/1991 | Inaba .............................. 341/26 |
| 5,983,116 A * | 11/1999 | Nash et al. ................. 455/575.1 |
| 6,184,805 B1 | 2/2001 | Uggmark | |
| 6,243,595 B1 | 6/2001 | Lee et al. | |
| 6,853,306 B1 | 2/2005 | Nitschke et al. | |
| 6,987,466 B1 | 1/2006 | Welch et al. | |
| 7,026,973 B2 | 4/2006 | Chu | |
| 7,256,768 B2 * | 8/2007 | Bathiche ....................... 345/168 |
| 7,688,230 B2 * | 3/2010 | DiFatta et al. .................. 341/22 |
| 7,782,230 B2 * | 8/2010 | Olodort et al. ................ 345/168 |
| 2002/0063690 A1 * | 5/2002 | Chung et al. .................. 345/168 |
| 2002/0154038 A1* | 10/2002 | Houston ......................... 341/22 |
| 2006/0007160 A1* | 1/2006 | Lutnick et al. ................ 345/168 |

OTHER PUBLICATIONS

Dribin, D., Keyboard Matrix Help, 1999-2000.
AVR243: Matrix Keyboard Decoder, Atmel Corporation, 2532A-AVR-01/03, 2003; http://www.atmel.com/dyn/resources/prod_documents/doc2532.pdf.

(Continued)

*Primary Examiner* — Mohammad Ghayour
*Assistant Examiner* — Jerold Murphy
(74) *Attorney, Agent, or Firm* — Soquel Group LLC

(57) ABSTRACT

An electronic keyboard including a plurality of keys arranged as a matrix, each key including a plunger, and a conductive element on the bottom of the plunger, the conductive element having a characteristic resistance, an electronic circuit having an input current source, and mounted on a surface beneath the plurality of keys such that when a key is pressed its conductive element closes a switch in the circuit, an analog-to-digital convertor for converting an output voltage of the circuit to a digital signal, and a controller for determining from the digital signal when a key is pressed, and for identifying the key that is pressed.

34 Claims, 10 Drawing Sheets

(56) References Cited

OTHER PUBLICATIONS

Krumsick, T., KeyTweak Web Page; http://webpages.charter.net/krumsick/.
Vidakovic, M. and Milisajevic, I., Keyboard Layout Manager; http://www.klm32.com/.
The Microsoft Keyboard Layout Creator; http://www.microsoft.com/globaldev/tools/msklc.mspx.
KbdEdit—The Best Keyboard Layout Editor for Windows XP, 2003, Vista and x64; http://www.kbdedit.com/.
Optimus Maximujs Keyboard, Art Lebedev Studio; http://www.artlebedev.com/everything/optimus/.
ERGODEX, DX1 Input System; http://ergodex.com/content12.php.

* cited by examiner

UNIQUELY IDENTIFIABLE KEYS FOR ELECTRONIC KEYBOARDS

FIELD OF THE INVENTION

The field of the present invention is electronic keyboards.

BACKGROUND OF THE INVENTION

A user interface (UI) is the means through which people interact with a machine, device, computer program or other complex tool, referred to generally as the "system". The UI provides the capability of entering user input, corresponding to the way a user manipulates the system, and produces output, enabling the system to exhibit the effect of the user's manipulation. In computer science and human-computer interaction, input generally refers to control sequences such as keystrokes with a computer keyboard, movements of a computer mouse, and touch-screen selections. Output generally refers to graphical, textual and auditory information that the system presents to the user.

The electronic keyboard is the most common of all UI input devices. Physically, keyboards are arrangements of buttons, or keycaps. Keycaps generally have characters engraved or printed on them. Generally, a key press produces a single written symbol. Some symbols may require pressing and/or holding two or more keys simultaneously or in succession; and some keys do not produce a symbol, but instead affect operation of the system or of the keyboard itself.

Electronic keyboards are included in computer systems that range from personal computers and laptop computers, which have large keyboards, to mobile computers, which have small keyboards. Large keyboards can accommodate many keys that are large enough to be easily pressed by fingers. Small keyboards use reduced size keys, or a reduced number of keys, or closer packing of keys, to meet the size constraints of the keyboards.

Another type of electronic keyboard in use today is the virtual laser keyboard. The laser keyboard uses a projector to project an image of a full size keyboard into a surface. Sensors in the projector identify key presses, and relay corresponding signals to the system.

Electronic keyboards are modeled in part after the typewriter. There are several keyboard symbol layouts in use today. Different keyboard layouts arise when people require easy access to different sets of symbols. Such layouts include layouts for different languages, and specialized layouts for calculators, for accounting applications and for computer programming.

Keyboards generally include between 80 and 110 keys, including typing keys, numeric keypad, function keys and control keys.

Reference is now made to FIG. 1, which is a prior art diagram of a QWERTY keyboard 100. The QWERTY keyboard was designed for mechanical typewriters, and is named for the first six letter keys in its layout. Letters were attached to freely-moving levers, and jamming would result if commonly-used letters were positioned too close to one another. With the advent of modern electronics, jamming of levers is no longer an issue. Nevertheless, QWERTY keyboards had been a de facto standard for decades prior to the advent of electronic keyboards, and the QWERTY layout was adopted for electronic keyboards because of its familiarity.

Reference is now made to FIG. 2, which is a prior art diagram of a DVORAK keyboard 200. The DVORAK keyboard layout positions vowels on the left side of the keyboard and the most common consonants on the right side. Most commonly user letters are positioned along the home row, which is the main row where the fingers are placed when one begins typing. The DVORAK keyboard was patented by A. Dvorak et al. in U.S. Pat. No. 2,040,248, as an alternative to the QWERTY keyboard. It is not in widespread use today. Other keyboard layouts include ABCDE, XPeRT, QWERTZ and AZERTY, each named for the first letters in its layout.

An electronic keyboard generally has its own processor, and circuitry that conveys information to and from the processor. A large portion of the circuitry comprises a keyboard matrix. A keyboard matrix is a grid of circuits beneath the keys. In most keyboards, with the exception of capacitive models described below, a circuit is broken at a point below each key. When a key is depressed, the key presses upon a switch, thereby completing a broken circuit and allowing a small amount of current to flow through. The mechanical action of the switch causes some vibration, referred to as "bounce", which the processor filters out. When a key is pressed and held down, the processor recognizes this as the equivalent of repeated key presses.

When the processor finds that a circuit is closed, the processor maps the location of the closed circuitry within the keyboard matrix to a character, using a character map stored in read-only memory. A character map is a look-up table, which informs the processor of the position of each key in the keyboard matrix, and what each keystroke or combination of keystrokes represents. E.g., the character map informs the processor that pressing the "a" key by itself corresponds to a lower case "a", and the pressing the "shift" key and the "a" key together corresponds to an upper case "A".

Reference is now made to FIG. 3, which is a prior art diagram of a keyboard matrix. The keyboard matrix of FIG. 3 is organized as a matrix of push buttons, connected with row and column wires. For purposes of clarification, FIG. 3 shows only a 3×3 keyboard matrix. A key press connects the key's row wire with the key's column wire. E.g., when the "a" key is pressed, column wire C1 is connected to row wire R1.

Keyboard matrices may be scanned in several ways. U.S. Pat. No. 4,725,816 to Petterson describes a keyboard scanner that detects which key of a keyboard matrix is pressed. When a key is pressed, a unique DC voltage is generated. An analog-to-digital convertor converts the voltage to a digital signal, which is analyzed to identify the key. Ambiguity is avoided by choosing resistors which, when coupled together with a current source, generate unique voltages.

Reference is now made to FIG. 4, which is a prior art diagram of a circuit 400 for a keyboard matrix that encodes key presses by means of voltages. Shown in FIG. 4 are individual keys 410*a*, 410*b*, ..., 410*i*. The bottoms of the keys have respective metal strips 420*a*, 420*b*, ..., 420*i*. When a key is pressed, its metal strip is depressed, and the strip comes in contact with two terminals and closes a branch of circuit 400. Thus metal strips 420*a*, 420*b*, ..., 420*i* serve as open switches that close when their keys are pressed.

When only single keys are pressed, a fast scanning method for circuit 400 is to first select all row lines and read the column results, and then select all column lines and read the row results. The returned row and column results are encoded into a unique scan-code for the specific key pressed. When multiple keys may be pressed simultaneously, the row lines are scanned separately in sequence, reading the column result for each row, in order to determine all keys that are pressed.

In various situations it is of great advantage to customize an electronic keyboard. For example, operating systems must customize keyboards that support multiple languages. Such multi-lingual keyboards generally have two symbols engraved or printed on each keycap, which enable a user to know which symbol is processed when the keyboard is used in each of the languages. Electronic keyboards may be customized (i) by customizing the functions that keys activate, and (ii) by customizing the layout of the keys within the keyboard matrix.

Customizing the functions that keys activate involves using custom character maps, overriding the default character map for the keyboard, so that the processor interprets key presses differently. Customizing key functions is useful for typing in a language that uses letters without English equivalents, on an English keyboard. Customizing key functions is also useful for accessibility settings that change keyboard behavior to adapt to disabilities. Customizing key functions may be used, for example, to convert a QWERTY keyboard to a DVORAK keyboard.

For systems such as GNU/Linux, which run on an X11 operating system, customization of key functions may be performed using xmodmap. For Windows systems, software is available for customization of key functions, such as KeyTweak developed by Travis Krumsick, Keyboard Layout Manager developed by M. Vidakovic and I. Milijasevic of the Slovak Republic, Keyboard Layout Creator developed by Microsoft Corporation of Redmond, Wash., and KbdEdit developed by Ivica Nikolic of Dublin, Ireland.

Customizing the layout of the keys involves changing locations of keys. The DX1 Input System, developed by Ergodex, Inc. of Mountain View, Calif., includes 25 numbered keys that can be rearranged at will.

Another approach to customizing the layout of the keys is illustrated in FIG. 5, which is a prior art diagram of a keyboard having a customizable layout by means of small touch screens on each key. The keyboard shown in FIG. 5 is an Optimus Maximus keyboard developed by Art Lebedev Design Studios. The Optimus Maximus keyboard is a full-size 113-key keyboard with color organic light-emitting diodes (OLEDs) on each key. Each key of the Optimus Maximus keyboard has a touch screen of dimensions 10.1 mm×10.1 mm and of 48×48 pixel resolution, which enable customizing the display, and thus the virtual location and function, of each key.

It will thus be appreciated by those skilled in the art that customization of electronic keyboards is complicated and requires character re-mapping software which assigns new identities to original keys. Moreover, when keys are re-mapped to new identities, the appearances of the keys are generally not altered, which makes it difficult for a user to know what the new identities of the keys are. The identity of a key depends on its position within the keyboard matrix.

There is thus a need for keyboards that are simple to customize, without requiring character re-mapping.

SUMMARY OF THE DESCRIPTION

Aspects of the present invention relate to an electronic keyboard with uniquely identifiable keys. Prior art keyboards include circuitry for uniquely identifying grid points within a keyboard matrix. In distinction, the present invention takes an approach of uniquely identifying keys. Each key is constructed with a conductive element having a characteristic electrical resistance. The "a" key, for example, has a different resistance than the "b" key, the "c" key, and any of the other keys. As a result, regardless of where the "a" key is positioned within the keyboard matrix, the keyboard recognizes it as the "a" key.

Using the present invention, keyboard layouts can be changed at will with complete flexibility, without having to change the appearances of the keys and without having to re-map characters to keyboard locations. Using the present invention, special purpose keys can be easily constructed and identified. Moreover, special purpose keypad plates can be constructed, and swapped in and out of keyboards.

Applications of the present invention include multi-lingual keyboards, and customization of keyboard layouts for people that are disabled, for calculators, and for specialized applications such as accounting applications and computer programming.

The present invention applies to large keyboards, such as computer and laptop keyboards, and to small keyboards, such as keypads on mobile phones, PDAs, cameras, media players, and other consumer electronics devices.

There is thus provided in accordance with an embodiment of the present invention an electronic keyboard including a plurality of keys arranged as a matrix, each key including a plunger, and a conductive element on the bottom of the plunger, the conductive element having a characteristic resistance, an electronic circuit having an input current source, and mounted on a surface beneath the plurality of keys such that when a key is pressed its conductive element closes a switch in the circuit, an analog-to-digital convertor for converting an output voltage of the circuit to a digital signal, and a controller for determining from the digital signal when a key is pressed, and for identifying the key that is pressed.

BRIEF DESCRIPTION OF THE DRAWINGS

The present invention will be more fully understood and appreciated from the following detailed description, taken in conjunction with the drawings in which.

DETAILED DESCRIPTION

Aspects of the present invention relate to an electronic keyboard with keys that can be rearranged at will, without having to change the appearances of the keys and without requiring re-mapping of characters to locations within a keyboard matrix. The keys themselves include conductive elements with distinct resistances, and the keyboard includes special electronic circuitry that enables unambiguous identification of keys when they are pressed. The circuitry is constructed so that each key acts as a switch and, when pressed, closes a branch of the circuitry with its conductive element. When more than one key is pressed, their resistances combine in parallel.

In distinction from prior art keyboards, which employ electrical circuits to identify locations within a keyboard matrix, the present invention uses an approach of uniquely identifying keys, regardless of where they are positioned within the keyboard matrix. I.e., the present invention provides identities to keys instead of identities to locations, and, as such, when a key is pressed the present invention is able to identify which pad is depressed, and its location within the keyboard matrix. Whereas prior art keyboards use elements attached to a keyboard surface for closing circuits, the present invention uses instead elements attached to key caps.

Figure 1:
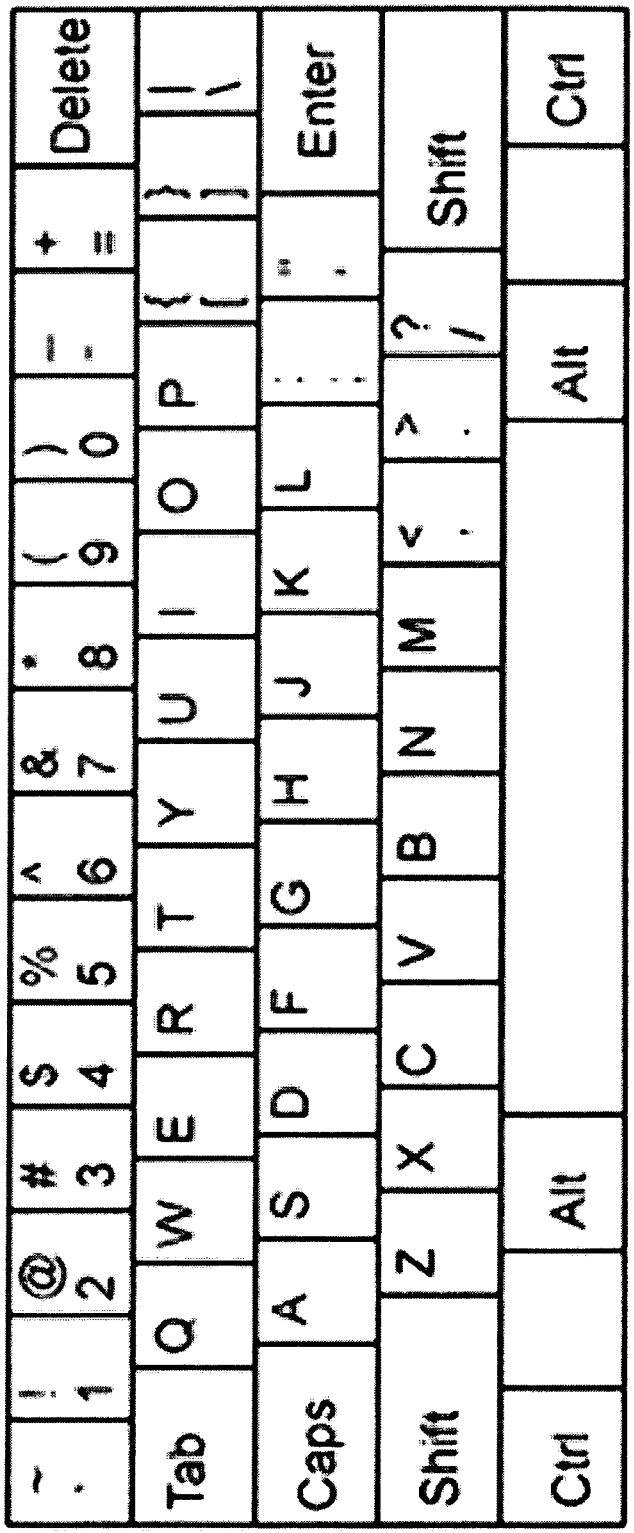
FIG. 1 is a prior art diagram of a QWERTY keyboard.
Figure 2:
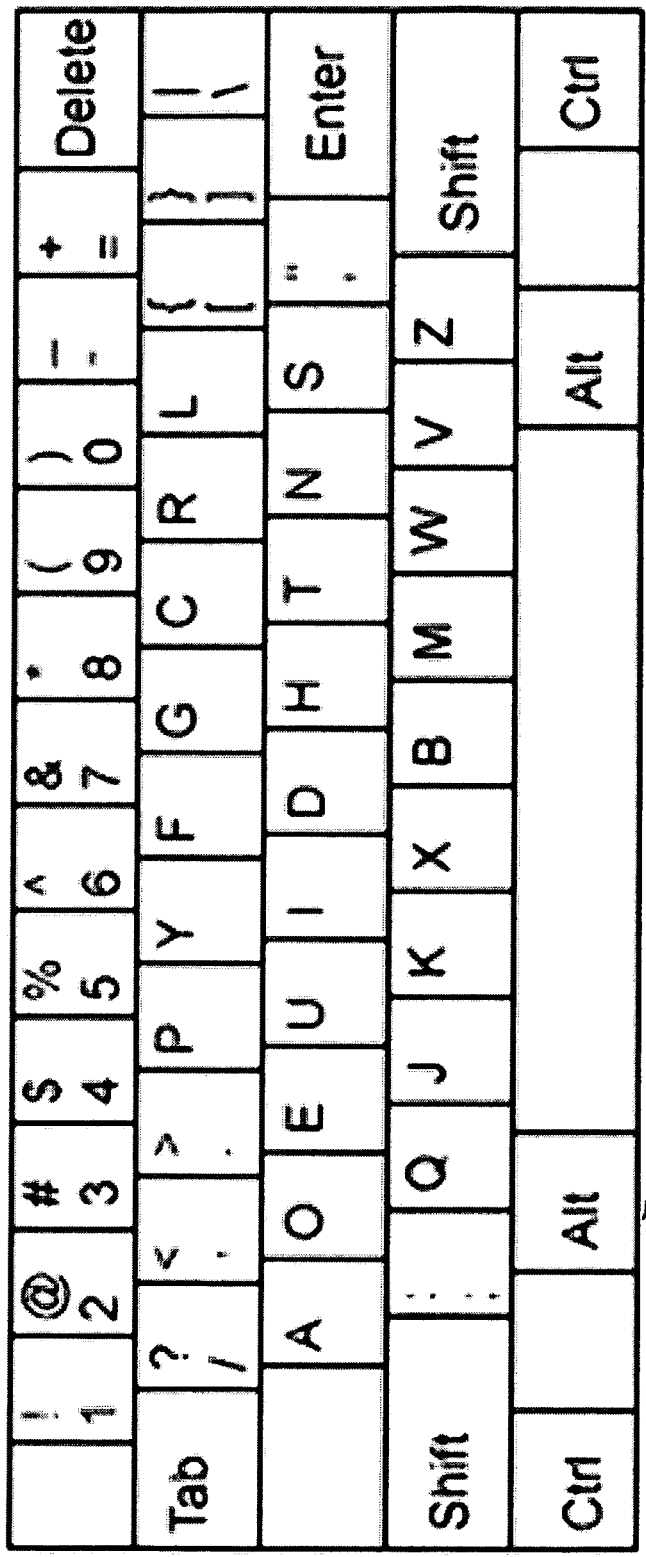
FIG. 2 is a prior art diagram of a DVORAK keyboard.
Figure 3:
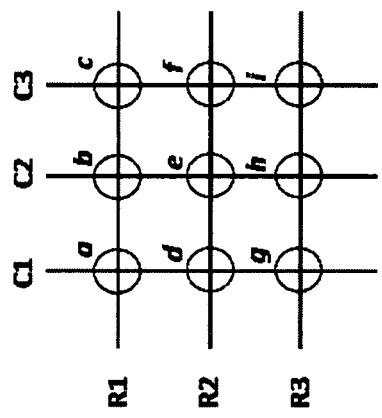
FIG. 3 is a prior art diagram of a keyboard matrix.
Figure 5:
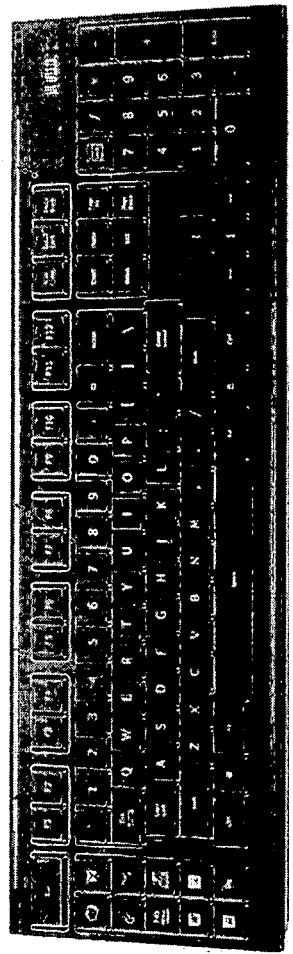
FIG. 5 is a prior art diagram of a keyboard having a customizable layout by means of small touch screens on each key.
Figure 4:
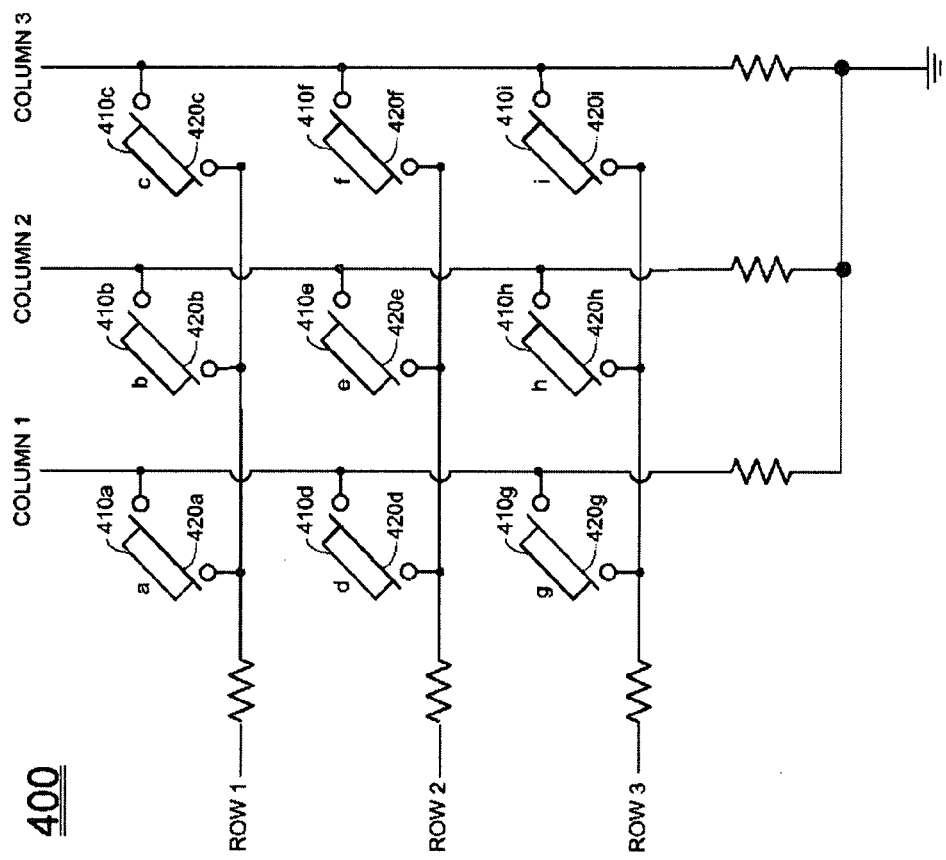
FIG. 4 is a prior art diagram of a circuit for a keyboard matrix that encodes key presses by means of voltages.
Figure 6A:
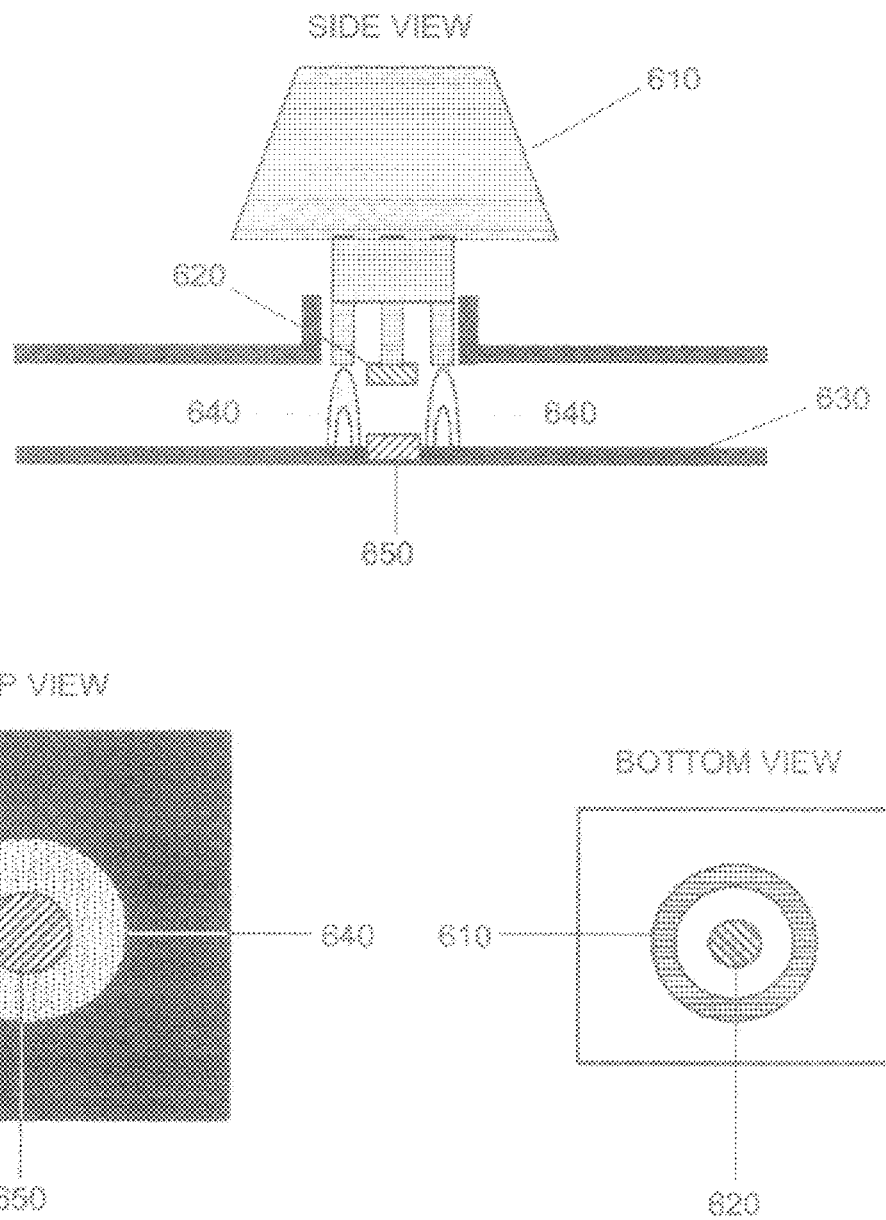
FIG. 6A is a set of three simplified cross-sectional diagrams of a keypad and a keyboard surface with a rubber dome, in accordance with an embodiment of the present invention.

Reference is now made FIG. 6A, which is a set of three simplified cross-sectional diagrams of a keypad and a keyboard surface with a rubber dome, in accordance with an embodiment of the present invention. Shown in FIG. 6A is a key 610 including a conductive element 620, which is a hard carbon. Key 610 is mounted above a keyboard surface 630. Keyboard surface 630 includes a circular rubber dome 640. When key 610 is pressed, a plunger on the bottom of key 610 pushes down against dome 640, and the hard carbon element 620 presses against a carbon element 650. As long as key 610 is held down, carbon element 620 completes a circuit. When key 610 is released, rubber dome 640 springs back to its original shape, forcing the key back to its rest position. Rubber dome keyboards are generally inexpensive, have good tactile response, and are resistant to spills and corrosion because of the rubber layer covering the keyboard matrix.

FIG. 6A also shows a top view of keyboard surface 630, and a bottom view of key 610. When key 610 is pressed, these two surfaces come into contact with one another.

In accordance with an embodiment of the present invention, carbon element 620 is built so as to have a unique characteristic resistance associated specifically with key 610. The resistance of carbon element 620 may be adjusted by adjusting the physical dimensions or material composition of element 620, or alternatively by inserting small resistors into element 620.

Figure 6B:
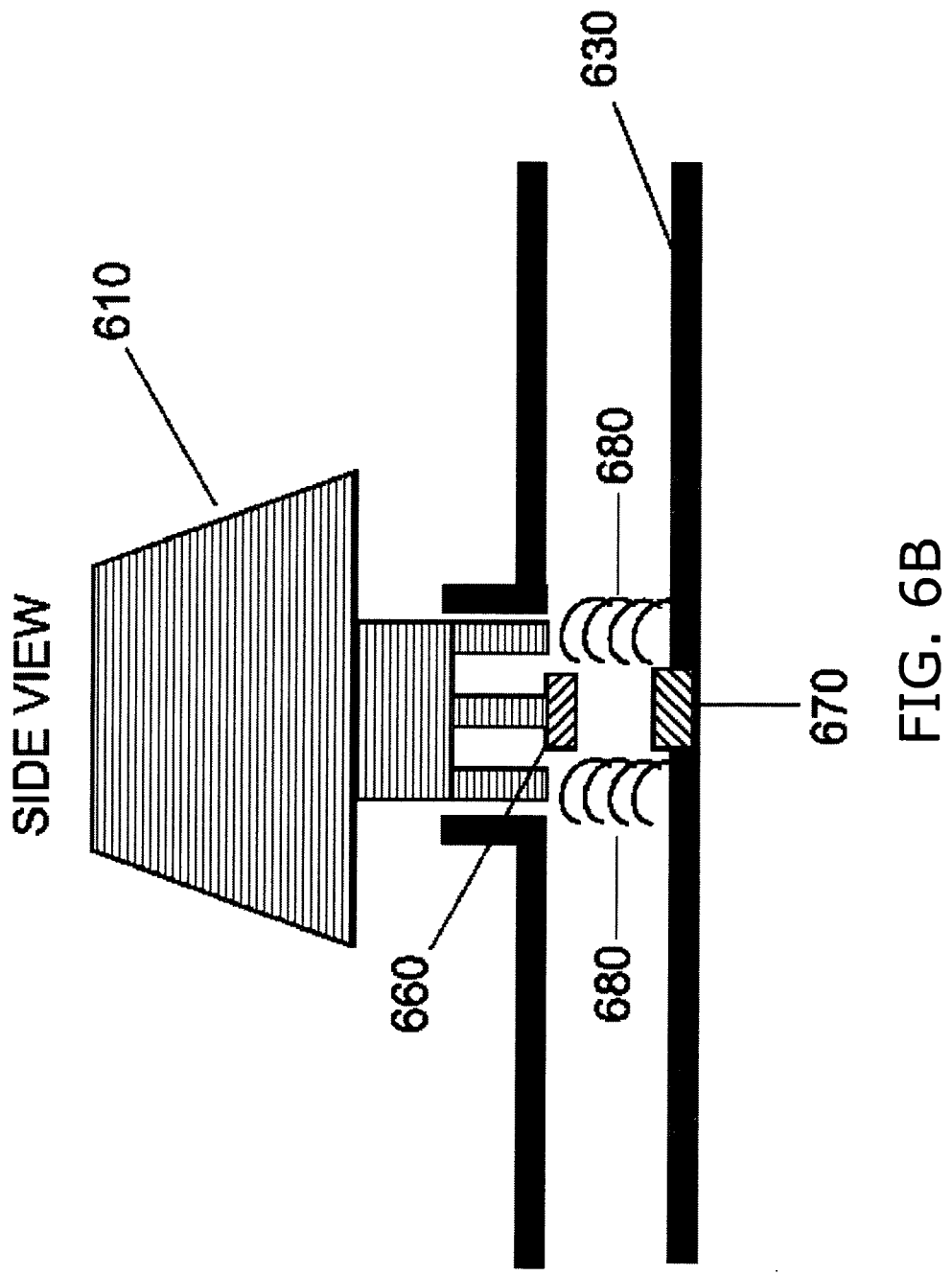
FIG. 6B is a simplified cross-sectional diagram of a keypad and a keyboard surface with springs, in accordance with an embodiment of the present invention.

Reference is now made to FIG. 6B, which is a simplified cross-sectional diagram of a keypad and a keyboard surface with springs, in accordance with an embodiment of the present invention. In FIG. 6B, key 610 includes metallic elements 660 and 670 instead of carbon elements 620 and 650, and keyboard surface 630 uses springs 680 instead of rubber dome 640, for forcing key 610 back to its rest position when key 610 is released. Alternatively, a spongy foam may be used instead of springs to force key 610 back to its rest position.

Figure 7:
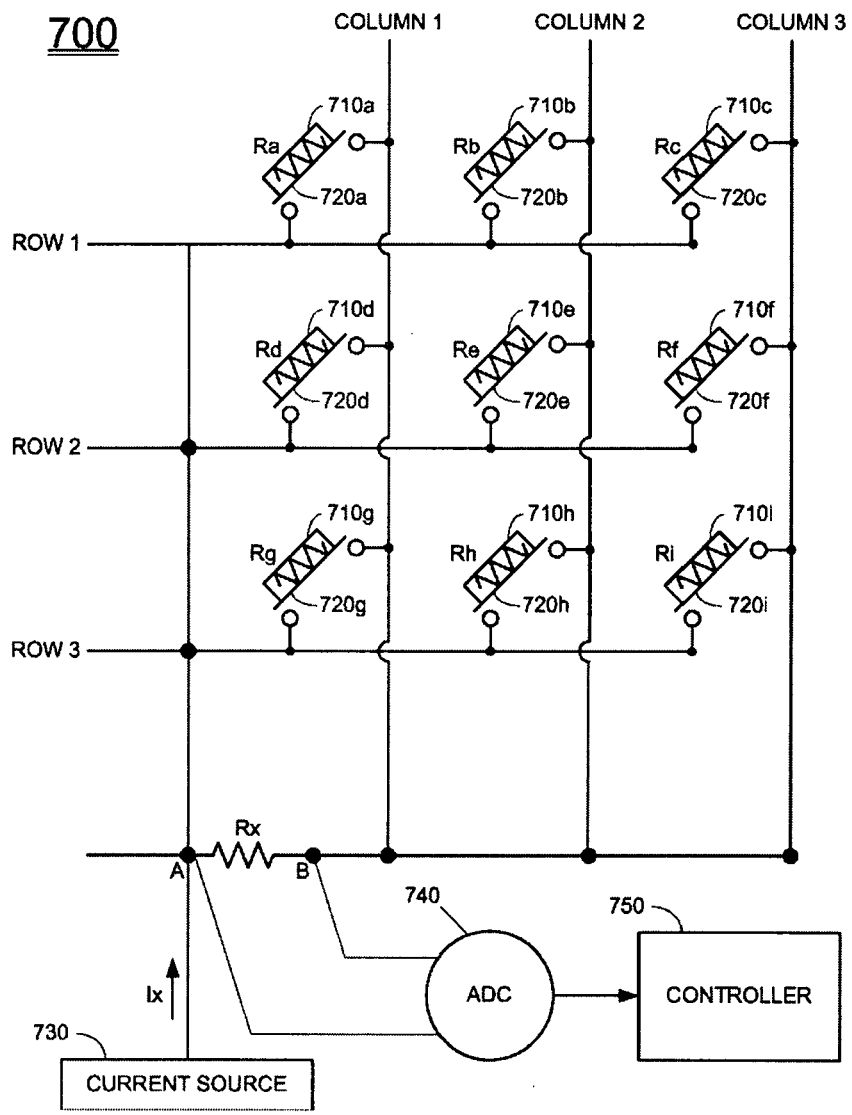
FIG. 7 is a diagram of an electrical circuit for connecting keypads of a keyboard, in accordance with an embodiment of the present invention.

The present invention employs keys that include conductive elements with characteristic resistances, at the bottoms of the key plungers. In this regard, reference is now made to FIG. 7, which is a diagram of an electrical circuit 700 for connecting keys of a keyboard, in accordance with an embodiment of the present invention. Shown in FIG. 7 are individual keys 710a, 710b, ..., 710i. The bottoms of the keys have respective conductive elements 720a, 720b, ..., 720i, with respective resistances $R_a$, $R_b$, ..., $R_i$. When a key is pressed, its conductive element is depressed, and the element comes in contact with two terminals and closes a branch of circuit 700. Thus conductive elements 720a, 720b, ..., 720i serve as open switches that close when their keys are pressed. Circuit 700 also includes a branch with two nodes, A and B, which are connected by a segment with a shunting resistor, $R_x$; and an input current source 730, with current, $I_x$, at node A.

Keys 710a, 710b, ..., 710i are arranged in a grid of rows and columns. The topology of circuit 700 is such that when a switch is closed, a new path is formed between nodes A and B. Thus, if switch 720a is closed, then a path is formed beginning at node A, moving upwards to ROW 1, then moving rightwards and through switch 720a, then moving downwards along COLUMN 1, and finally leftwards to node B. The total resistance along this path from A to B is $R_a$. There are then two parallel paths between A and B; namely, the branch having resistance $R_x$, and the newly formed path having resistance $R_a$. The two resistances combine in parallel.

Figure 8:
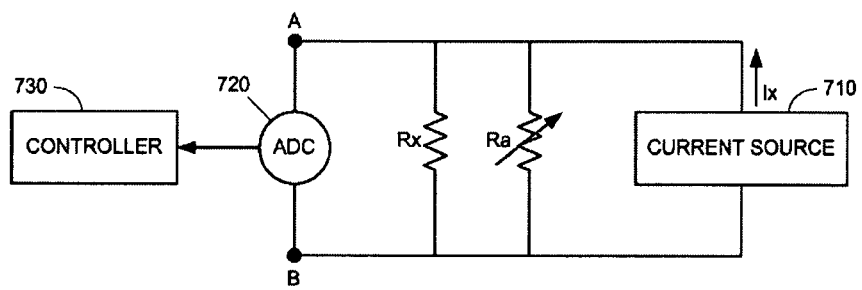
FIG. 8 is a simplified diagram of an electrical circuit when a keypad is depressed, in accordance with an embodiment of the present invention.

Reference is now made to FIG. 8, which is a simplified diagram of circuit 700 when a keypad is depressed, in accordance with an embodiment of the present invention. The simplified circuit in FIG. 8 is equivalent to circuit 700 when switch 720a is closed. As shown in FIG. 8, there are two parallel paths connecting nodes A and B; one with resistance $R_x$ and the other with resistance $R_a$. The voltage drop from A to B is thus given by $$V_{AB} = I_x \frac{R_a R_x}{R_a + R_x}. \tag{1}$$

If the shunting resistance, $R_x$, is much larger than the switch resistances, $R_a$, $R_b$, ..., $R_i$, then the branch between A to B is effectively open-circuited, and the voltage drop between A and B is then approximately $$V_{AB} = I_x R_a. \tag{2}$$

Referring back to FIG. 7, an analog to digital convertor (ADC) 740 converts the analog voltage $V_{AB}$ to a digital signal. The digital signal is then transmitted to a controller 750, which determines whether a key is being pressed and, if so, which key is pressed, based on the digital signal received from ADC 740.

Typical values for $I_x$ are on the order of 1 mA or less, and typical values for $V_{AB}$ are on the order of 1 V or less.

In accordance with an embodiment of the present invention, the resistances $R_a$, $R_b$, ..., $R_i$ are chosen so that the corresponding voltage drops $V_{AB}$, as determined by EQ. 2, are digitized by ADC 740 to different signal values. The signal values then uniquely determine the keys.

Signal discrimination of ACD 740 is given by $$Q = \frac{E_{FSR}}{2^M}, \tag{3}$$

where Q is the resolution in volts/step, $E_{FSR}$ is the full-scale voltage range of ADC 740, and M is the resolution in bits of ADC 740. For example, if ADC 640 has a resolution of 12 bits and a full-scale voltage range of 5V, then Q=1.22 mV. Thus, if the resistances $R_a$, $R_b$, ..., $R_i$ are chosen so that the corresponding voltage drops $V_{AB}$, as determined by EQ. 2, all differ by at least 1.22 mV, then the digital signal input to controller 750 will suffice to discriminate among the keys.

Furthermore, it will be appreciated from the topology of circuit 700 that if a combination of keys are depressed, then their switches close to form parallel paths connecting nodes A and B. For example, if the keys for "a" and "b" are simultaneously depressed, then two new paths are formed between A and B; one path via the switch 720a and another path via switch 720b. The resulting voltage drop $V_{AB}$, between nodes A and B, corresponds to that of the parallel-combined resistance of $R_a$ with $R_b$, namely $$V_{AB} = I_x \frac{R_a R_x}{R_a + R_x}. \tag{4}$$

As above, EQ. 4 is based on the assumption that the shunting resistance $R_x$ is much larger than any of the resistances $R_a$, $R_b$, ..., $R_i$, and can thus be ignored.

Therefore if the resistances $R_a$, $R_b$, ..., $R_i$ are chosen so that all combinations of two of them in parallel are distinguishable via ADC 740, then controller 750 is able to uniquely identify pairs of keypads that are simultaneously depressed. For a keyboard with 80 keypads, for example, there are only 80+3160=3240 possible single and double key press possibilities, whereas a 12-bit ADC is able to encode 4096 voltage levels.

Regarding the actual arithmetic itself of finding values of the resistances $R_a$, $R_b$, ..., $R_i$ so that all combinations of them in parallel are distinguishable, this is an elementary exercise for those skilled in the art. In fact, values of the resistances may be chosen sequentially, $R_a$, $R_b$, ..., almost arbitrarily, including trial-and-error, by simply ensuring that the next value chosen is not eaual to one of the combinations in parallel of previous values chosen, and does not combine with one of the combinations in parallel of previous values chosen to eaual a different combination in parallel of previous values chosen. It is noted that the prime numbers have the property that if $p_1, p_2, \ldots, p_n$ are distinct prime numbers, and if $q_1, q_2, \ldots, q_m$ are distinct prime numbers, then the two parallel sums $$\frac{1}{p_1} + \frac{1}{p_2} + \ldots + \frac{1}{p_n} \text{ and } \frac{1}{q_1} + \frac{1}{q_2} + \ldots + \frac{1}{q_m}$$

are equal if and only if the sets $\{p_1, p_2, \ldots, p_n\}$ and $\{q_1, q_2, \ldots, q_m\}$ are identical. Thus, using prime numbers to determine the resistances $R_a$, $R_b$, ..., $R_i$ guarantees that closing any combination of switches in circuit 700 results in distinct voltage drops $V_{AB}$. For example, to accommodate 25 rearrangable keys, such as in the DX1 Input System of Ergodex mentioned above, the first 25 prime numbers 2, 3, 5, 7, .., 97 suffice to determine suitable resistances.

It will be appreciated by those skilled in the art that duplicate keys may be placed in a keyboard, in accordance with an embodiment of the present invention. For example, a keyboard may have two number pads with keys 0-9, one pad on its right and one pad on its left. Since the keys are uniquely identifiable, electrical circuit 700 identifies each one of duplicate keys according to its resistance, irrespective of how many duplicates are present. Thus, regardless of whether a user presses a number key in a number pad at the right of the keyboard, or a number key in a number pad at the left of the keyboard, electrical circuit 700 identifies the number that is pressed.

Figure 9:
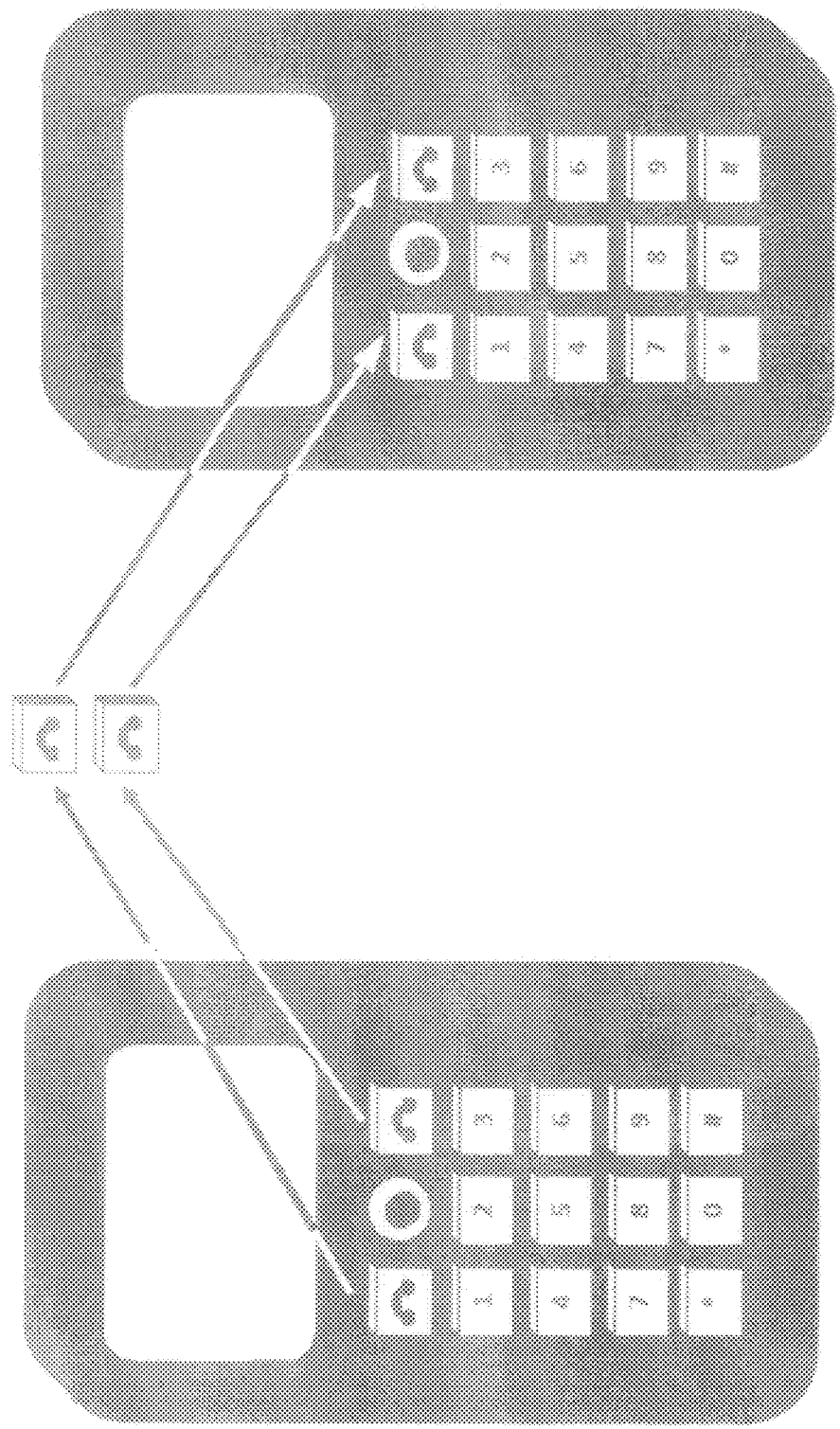
FIG. 9 is an illustration of rearranging keypads on a mobile phone, in accordance with an embodiment of the present invention.

The present invention applies to a wide variety of electronic keyboards, including small keyboards such as those used with mobile phones and personal digital assistants (PDAs). In this regard, reference is now made to FIG. 9, which is an illustration of rearranging keys on a mobile phone, in accordance with an embodiment of the present invention.

Figure 10:
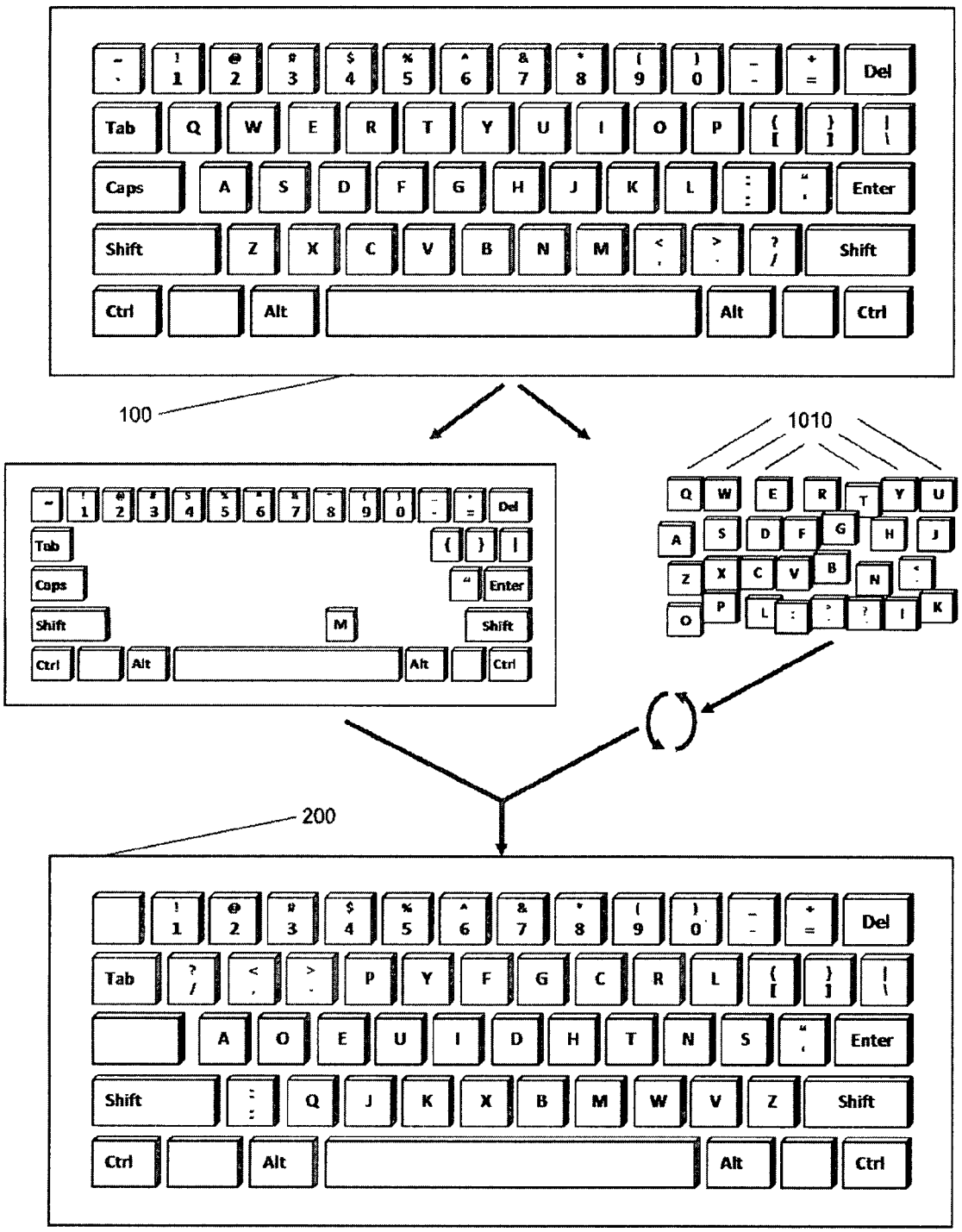
FIG. 10 is an illustration of rearranging keypads of a keyboard, in accordance with an embodiment of the present invention.

It will be appreciated by those skilled in the art that the present invention enables changing keyboard layouts by simply replacing keys. The appearance of the keys does not have to be changed; an "a" key remains a key for "a" regardless of where it is positioned within the keyboard matrix. In this regard, reference is now made to FIG. 10, which is an illustration of rearranging keys 1010 of a keyboard, in accordance with an embodiment of the present invention. Shown in FIG. 10 is a QWERTY keyboard 100 built using keys 1010 of the present invention. Keys 1010 of QWERTY keyboard 100 are removed and rearranged so as to form a DVORAK keyboard 200. Other than physically rearranging keys 1010, no character map modifications are necessary, since each key retains its identity.

Figure 11:
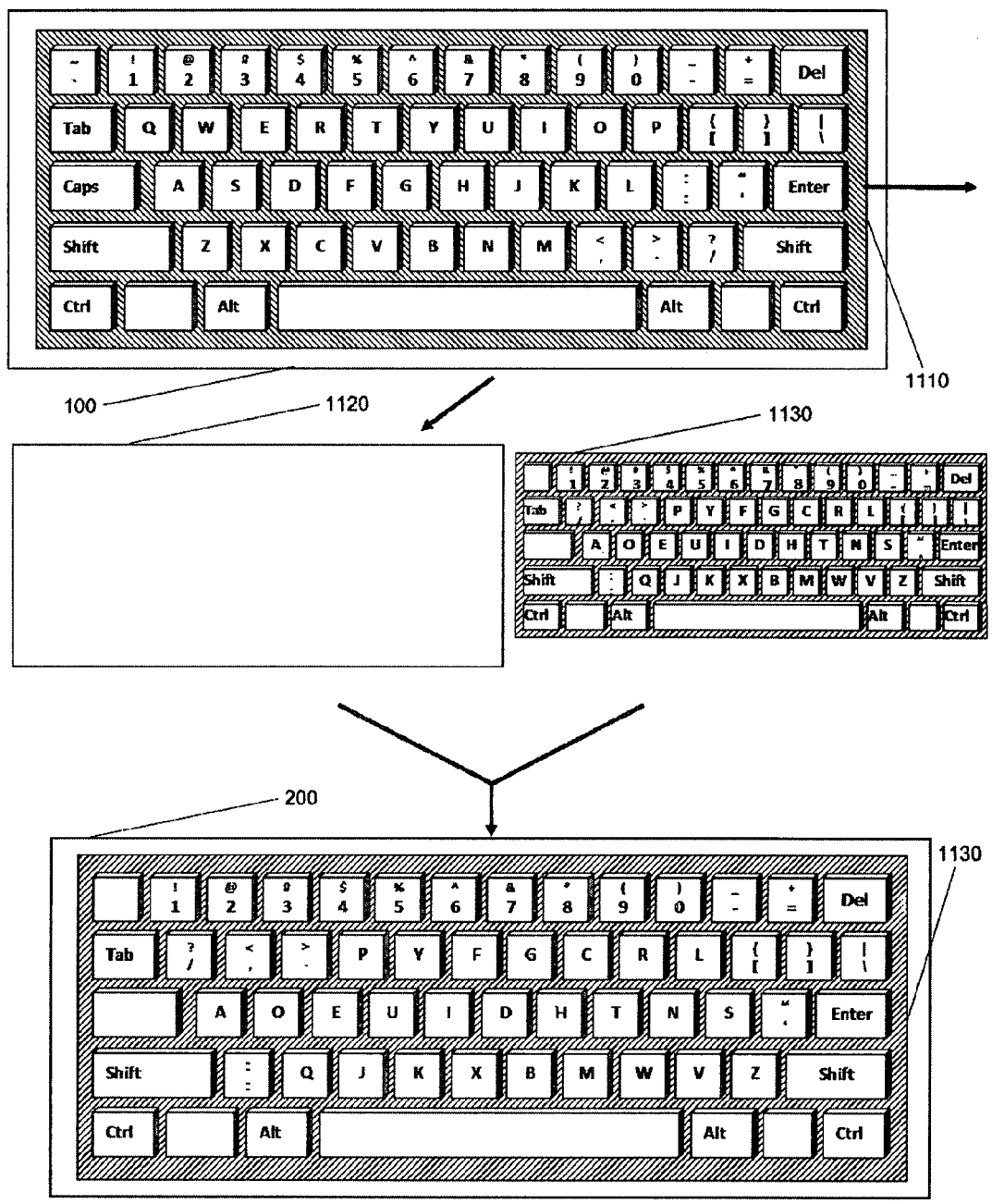
FIG. 11 is an illustration of swappable keypad plates, in accordance with an embodiment of the present invention.

Reference is now made to FIG. 11, which is an illustration of swappable keypad plates, in accordance with an embodiment of the present invention. Shown in FIG. 11 is a QWERTY keyboard built using a plate 1110 of keys of the present invention. Plate 1110 is attached to a surface 1120, to form QWERTY keyboard 100. Plate 1110 is removable, and be can be swapped with another plate 1130, conforming to a DVORAK keyboard. By attaching plate 1130 to surface 1120, instead of plate 1110, QWERTY keyboard 100 is converted to DVORAK keyboard 200. As with the configuration of FIG. 10, other than physically swapping plates 1110 and 1130, no character map modifications are necessary, since each key retains its identity.

It will be appreciated by those skilled in the art that whereas prior art keyboards use elements attached to a keyboard surface to uniquely identify keyboard locations, aspects of the present invention use instead elements attached to keys for uniquely identifying the keys themselves. A sensor on the keyboard surface measures or scans the elements and thereby identifies the keys. As such, persons skilled in the art will realize that there are many different ways of uniquely identifying keys, all within the scope of the present invention.

Keys may be identified by unique configurations of pins at the bottoms of the keys. Using 10 pins, for example, enables unique discrimination for $2^{10}=1024$ keys. When such a key is pressed, its pins press on a switch on the keyboard surface, which identifies the pin configuration of the pressed key.

Keys may be identified by characteristic electrical resistances, as illustrated in FIG. 7. Correspondingly, the sensor on the keyboard is an electrical circuit that is used to measure the resistances.

Keys may be identified by characteristic electrical capacitances. Correspondingly, the sensor on the keyboard is a electrical circuit that is used to measure the capacitances.

Keys may be identified by magnets that generate unique magnetic field strengths. Correspondingly, the sensor on the keyboard is a magnetic sensor that measures field strengths.

Keys may be uniquely identified by magnets that generate unique magnetic field directions. Correspondingly, the sensor on the keyboard is a magnetic sensor that measures field directions.

Keys may be uniquely identified by bar codes on the keys. Correspondingly, the sensor on the keyboard includes one or more bar code readers. When a key is pressed, it moves into the field of view of a bar code reader. A single bar code reader may be used for several keys, such as keys in a single row, or possibly for all of the keys, depending upon the aperture angle and type of the bar code reader.

Keys may be identified by characteristic optical properties, including inter alia optical density, optical reflectivity, optical fluorescence and optical translucence. Correspondingly, the sensor on the keyboard is an optical sensor.

Keys may be uniquely identified by small memories in the keys, with unique codes stored therein. Correspondingly, the sensor on the keyboard is memory reader.

Keys may be identified by unique holographs on the keys. Correspondingly, the sensor on the keyboard is a holograph reader.

It will further be appreciated by those skilled in the art that applications of the present invention abound. Such applications include inter alia design of multi-lingual keyboards, design of calculators, and introduction of new keys with non-standard functions. The present invention also applies to keyboards with alteration keys, such as English-Hebrew keyboards that can be toggled between English and Hebrew.

In the foregoing specification, the invention has been described with reference to specific exemplary embodiments thereof. It will, however, be evident that various modifications and changes may be made to the specific exemplary embodiments without departing from the broader spirit and scope of the invention as set forth in the appended claims. Accordingly, the specification and drawings are to be regarded in an illustrative rather than a restrictive sense.

What is claimed is:

1. An electronic keyboard, comprising:
    a plurality of keys arranged as a matrix of two or more rows and two or more columns, each key comprising:
        a plunger; and
        a conductive element on the bottom of said plunger said conductive element having a characteristic resistance;
    an electrical circuit mounted on a surface beneath said plurality of keys, comprising:
        a current source outputting a current, $I_x$ to a node whereby the current $I_x$ passes through a fixed resistance, $R_x$, when no key of the keyboard is depressed and passes through a variable resistance, $(R_x*R_I)/(R_x+R_I)$, when any combination of keys is depressed where $R_I$ is a unique value for each combination of keys that may depressed; and
        an analog-to-digital convertor coupled with said electrical circuit such that a voltage in ut to the analog to digital convert is one of $(I_x*R_x)$ or $(I_x \cdot (R_x*R_I)/(R_x+R_I))$, for converting the voltage input to a digital signal;
    and a controller coupled with said analog-to-digital convertor for determining from the digital signal generated by said analog-to-digital convertor that two keys are simultaneously pressed, and for identifying the two keys that are pressed, for any two of said plurality of keys.

2. The electronic keyboard of claim 1 wherein the conductive element is a metal element.

3. The electronic keyboard of claim 1 wherein the conductive element is a hard carbon element.

4. The electronic keyboard of claim 1 further comprising rubber domes mounted on the surface beneath said plurality of keys, which compress to allow said keys to close the switches in said circuit when said keys are pressed, and which expand to force said keys back to their resting positions when said keys are released.

5. The electronic keyboard of claim 1 further comprising springs mounted on the surface beneath said plurality of keys, which compress to allow said keys to close the switches in said circuit when said keys are pressed, and which expand to force said keys back to their resting positions when said keys are released.

6. The electronic keyboard of claim 1 further comprising a spongy foam fixed on the surface beneath said plurality of keys, which compresses to allow said keys to close the switches in said circuit when said keys are pressed, and which expands to force said keys back to their resting positions when said keys are released.

7. The electronic keyboard of claim 1 wherein said plurality of keys are individually removable, and can be rearranged within the keyboard matrix.

8. The electronic keyboard of claim 1 wherein said plurality of keys form a keypad plate, which can be attached in its entirety to the keyboard.

9. The electronic keyboard of claim 1 wherein said electronic circuit is such that when two keys are simultaneously pressed, their the characteristic resistances of their conductive elements combine in parallel circuit paths between said two nodes.

10. The electronic keyboard of claim 1 wherein the characteristic resistances of the conductive elements are such that no two keys and no two combinations of keys yield an equivalent resistance between said two nodes.

11. The electronic keyboard of claim 1 wherein said controller determines from the digital signal generated by said analog-to-digital convertor that three keys are simultaneously pressed, and identifies the three keys that are pressed, for any three of said plurality of keys.

12. The electronic keyboard of claim 1 wherein said controller determines from the digital signal generated by said analog-to-digital convertor that a combination of two or more keys are simultaneously pressed, and identifies the keys that are pressed, for any combination of two or more of said plurality of keys.

13. An electronic keyboard, comprising:
    a plurality of keys that can be arranged arbitrarily in a corresponding plurality of fixed locations of two or more rows and two or more columns, each individual key being uniquely distinct from the others of the plurality of keys;
    and an electrical circuit mounted on a keyboard surface beneath said plurality of keys, comprising:
        a current source outputting a current, $I_x$ to a node whereby the current $I_x$ passes through a fixed resistance $R_x$, when no key of the keyboard is depressed and passes through a variable resistance of one of $(R_x*R_I)/(R_x+R_I)$, when any combination of keys is depressed, where $R_I$ is a unique value for each combination of keys that may depressed;
        and a sensor for identifying that two keys are simultaneously pressed and the identities of the two keys that are pressed, for any arrangement of said plurality of keys in the fixed locations, coupled to the electrical circuit such that a voltage input to the sensor is one of $(I_x*R_x)$ or $(I_x \cdot (R_x*R_I)/(R_x+R_I))$ based on the distinctions of the keys.

14. The electronic keyboard of claim 13 wherein each of said plurality of keys has a distinct electrical capacitance, and wherein said electrical circuit comprises switches at the plurality of fixed locations.

15. The electronic keyboard of claim 13 wherein each of said plurality of keys has a distinct electrical capacitance, and wherein said electrical circuit comprises switches at the plurality of fixed locations.

16. The electronic keyboard of claim 13 wherein said sensor is operative to identify that three keys are simultaneously pressed and the identities of the three keys that are pressed, for any arrangement of said plurality of keys in the fixed locations, based on the distinctions of the keys.

17. The electronic keyboard of claim 13 wherein said sensor is operative to identify that a combination of two or more keys are simultaneously pressed and the identities of the keys that are pressed, for any arrangement of said plurality of keys in the fixed locations, based on the distinctions of the keys.

18. An electronic keyboard, comprising:
a plurality of keys arranged as a matrix of two or more rows and two or more columns, each key comprising:
a plunger; and a conductive element on the bottom of said plunger; an electrical circuit mounted on a surface beneath said plurality of keys, comprising:
respective switches under said plurality of keys; non-crossing row and column lines for which each switch opens and closes a respective circuit segment between a row line and a column line;
a current source outputting a current, $I_x$ to a node whereby the current $I_x$ passes through a fixed resistance, $R_x$, when no key of the keyboard is depressed and passes through a variable resistance, $(R_x*R_f)/(R_x+R_f)$, when any combination of keys is depressed where $R_f$ is a unique value for each combination of keys that may depressed;
an analog-to-digital convertor coupled with said electrical circuit such that a voltage input to the analog to digital convert is one of $(I_x*R_x)$ or $(I_x \cdot (R_x*R_f)/(R_x+R_f))$, for converting the input voltage to a digital signal;
and a controller coupled with said analog-to-digital convertor for receiving the digital signal generated by said analog-to-digital convertor.

19. The electronic keyboard of claim 18 wherein the conductive element is a metal element.

20. The electronic keyboard of claim 18 wherein the conductive element is a hard carbon element.

21. The electronic keyboard of claim 18 further comprising rubber domes mounted on the surface beneath said plurality of keys, which compress to allow said keys to close said switches when said keys are pressed, and which expand to force said keys back to their resting positions when said keys are released.

22. The electronic keyboard of claim 18 further comprising springs mounted on the surface beneath said plurality of keys, which compress to allow said keys to close said switches when said keys are pressed, and which expand to force said keys back to their resting positions when said keys are released.

23. The electronic keyboard of claim 18 further comprising a spongy foam fixed on the surface beneath said plurality of keys, which compresses to allow said keys to close said switches when said keys are pressed, and which expands to force said keys back to their resting positions when said keys are released.

24. The electronic keyboard of claim 18 wherein said plurality of keys are individually removable, and can be rearranged within the keyboard matrix.

25. The electronic keyboard of claim 18 wherein said plurality of keys form a keypad plate, which can be attached in its entirety to the keyboard.

26. The electronic keyboard of claim 18 wherein each conductive element of said plurality of keys has a characteristic resistance, and wherein when two keys are simultaneously pressed, the characteristic resistances of their conductive elements combine in parallel circuit paths between said two nodes.

27. The electronic keyboard of claim 18 wherein the characteristic resistances of the conductive elements are such that no two keys and no two combinations of keys yield an equivalent resistance between said two nodes.

28. The electronic keyboard of claim 18 wherein said controller determines from the digital signal generated by said analog-to-digital convertor that three keys are simultaneously pressed, and identifies the three keys that are pressed, for any three of said plurality of keys.

29. The electronic keyboard of claim 18 wherein said controller determines from the digital signal generated by said analog-to-digital convertor that a combination of two or more keys are simultaneously pressed, and identifies the keys that are pressed, for any combination of two or more of said plurality of keys.

30. An electronic keyboard, comprising:
a plurality of keys that can be arranged arbitrarily in a corresponding plurality of fixed locations of two or more rows and two or more columns, each individual key being uniquely distinct from the others of the plurality of keys; and
an electrical circuit mounted on a keyboard surface beneath said plurality of keys, comprising:
non-crossing row and column lines;
a plurality of switches at the plurality of fixed locations, each switch opening and closing a circuit segment between a row line and a column line;
a current source outputting a current, $I_x$ to a node whereby the current $I_x$ passes through a fixed resistance, $R_x$, when no key of the keyboard is depressed and passes through a variable resistance, $(R_x*R_f)/(R_x+R_f)$, when any combination of keys is depressed, where $R_f$ is a unique value for each combination of keys that may depressed;
such that when a key is pressed its conductive element closes one of said switches, thereby forming a circuit path developing a voltage of $(I_x \cdot (R_x*R_f)/(R_x+R_f))$ that is unique to the key being pressed.

31. The electronic keyboard of claim 30 wherein each of said plurality of keys has a distinct electrical resistance.

32. The electronic keyboard of claim 30 wherein each of said plurality of keys has a distinct electrical capacitance.

33. The electronic keyboard of claim 30 further comprising a sensor operative to identify that three keys are simultaneously pressed and the identities of the three keys that are pressed, for any arrangement of said plurality of keys in the fixed locations, based on the distinctions of the keys.

34. The electronic keyboard of claim 30 further comprising a sensor operative to identify that a combination of two or more keys are simultaneously pressed and the identities of the keys that are pressed, for any arrangement of said plurality of keys in the fixed locations, based on the distinctions of the keys.

* * * * *